United States Patent [19]

Hsieh et al.

[11] Patent Number: 4,963,824
[45] Date of Patent: Oct. 16, 1990

[54] DIAGNOSTICS OF A BOARD CONTAINING A PLURALITY OF HYBRID ELECTRONIC COMPONENTS

[75] Inventors: Edward P. Hsieh, Bedford Hills, N.Y.; Maurice T. McMahon, San Jose, Calif.; Henri D. Schnurmann, Monsey, N.Y.

[73] Assignee: International Business Machines Corporation, Armonk, N.Y.

[21] Appl. No.: 267,409

[22] Filed: Nov. 4, 1988

[51] Int. Cl.$^5$ ............................ G01R 1/02; G01R 1/04
[52] U.S. Cl. ................................. 324/158 R; 324/72.5; 324/158 P; 324/158 F
[58] Field of Search ............ 324/73 PC, 73 R, 73 AT, 324/158 R, 158 P, 158 F, 72.5; 371/16.1, 23, 27, 16.2

[56] References Cited

U.S. PATENT DOCUMENTS

| | | | |
|---|---|---|---|
| 3,924,181 | 12/1975 | Alderson | 371/27 |
| 4,055,806 | 10/1977 | Patel | 324/73 R |
| 4,465,972 | 8/1984 | Sokolich | 324/73 PC |
| 4,513,418 | 4/1985 | Bardell, Jr. et al. | 324/73 R |
| 4,519,078 | 5/1985 | Komonytsky | 324/73 R |
| 4,622,647 | 11/1986 | Sagnard et al. | 371/27 |
| 4,687,988 | 8/1987 | Eichelberger et al. | 324/73 R |
| 4,701,916 | 10/1987 | Naven et al. | 371/27 |
| 4,745,355 | 5/1988 | Eichelberger et al. | 324/73 R |

FOREIGN PATENT DOCUMENTS

| | | | |
|---|---|---|---|
| 0227312 | 7/1987 | European Pat. Off. | 324/158 P |
| 2520900 | 5/1976 | France | 324/158 F |

OTHER PUBLICATIONS

"Open Circuit Detector", by Kearley et al., IBM Tech. Disc. Bull., vol. 16, #3, 8/73, pp. 732–733.

Primary Examiner—Reinhard J. Eisenzopf
Assistant Examiner—W. Burns
Attorney, Agent, or Firm—John D. Crane; Donald M. Boles

[57] ABSTRACT

A method and circuitry for testing in situ the components mounted on a circuit board. First, a component is removed from the board. A testing circuit is then installed in place of the removed component. The testing circuit allows test patterns to be applied to a selected component on the board from the board I/O pins. The selected component responses are collected by the testing circuit and applied to the board output pins. In this manner, individual components on the board can be tested in situ from pins on the board.

13 Claims, 5 Drawing Sheets

DIAGNOSTICS OF A BOARD CONTAINING A PLURALITY OF HYBRID ELECTRONIC COMPONENTS

FIELD OF THE INVENTION

This invention relates broadly to the field of diagnostics of a fully populated electronic package which typically has a plurality of integrated circuit chips, multichip modules, cards, etc.. Unit-in-place diagnostics is one form of diagnostic which can be performed sequentially on each individual board component or jointly on a group of selected board components. The present invention, however, has particular utility when these electronic components to be tested are a mixed combination of structured and unstructured designs.

BACKGROUND AND DESCRIPTION OF PRIOR ART

Several trends have adversely affected the task of testing populated printed circuit boards that have made the diagnostics of failing components both difficult and costly.

First, the density of integrated circuit components and of electronic packages continues to increase. Designers at &he chip level do not always concern themselves with designing a chip so it can be easily tested a& either the chip level or in a populated card or board. As a consequence, chips, multi-chip modules, and cards oftentimes lack the necessary facilities that would enable a board to be tested in an economical and efficient manner.

Second, the increased proliferation of surface-mount packages with limited access to internal interconnections has forced the development of costly fixtures that accommodate probing of closely spaced input/output pins, i.e., (I/O's). This often leads to the use of functional patterns as an alternative, which is not always thorough or desirable.

In accordance with one prior art approach, the testing of a board comprised of a plurality of electronic components of diverse nature and origin requires the testing of each component separately and then mounting each component on the board. The board is then tested as a single entity, applying to it a set of test vectors generated to detect a substantial percentage of possible failures within the board. This technique is referred by those versed in this art as "Through-the-Pins-Testing". As its name implies, testing is achieved through the board I/O's which provide the necessary means of communication with the outside world. As the name of this technique also implies, the board is viewed as a single entity to be tested in its entirety at one time, and not as the concatenation of a plurality of independent components.

"Through-the-Pins-Testing" has the disadvantage or requiring the handling of a very large logic model which is necessary to generate the aforementioned set of test vectors. A large logic model requires a large mainframe and its processing during test generation and fault isolation consume much CPU time. Furthermore, 100% test coverage cannot always be guaranteed even for a structured logic design. This method also requires an expensive computer driven automatic tester with at least as many channels as board I/O's. The availability of such a tester is not always easily attainable, thus making this testing technique oftentimes impractical.

Schnurmann, in U.S. Pat. No. 4,348,759, entitled: "Automatic Testing or Complex Semiconductors on Testers with Insufficient Channels" proposes using multiplexors to group inputs of equal electrical characteristics and apply test patterns to the several groups of primary inputs through the multiplexors. Responses are observed at the output channels as it is ordinarily done on any tester. This method is limited if the number of grouped inputs and individual outputs exceed the number of available tester channels.

Another testing technique that is widely used is known as "Chip-in-Place Test". This technique requires an array of precisely positioned exposed contact pads for each chip contained and interconnected in the high circuit density packaging structure. This array of contact pads, referred to "EC pads" (for Engineering Change Pads) is utilized by a mechanical test probe head in the testing of each individual chip subsequent to interconnection of the chip in the high circuit density packaging structure, such as a multi-chip module, card, board, etc. This method has the disadvantage of requiring the alignment and subsequent stepping of the probe over the surface of the package, a time consuming process. Moreover, since the probe head contacts one chip site at a time, the connections between the chips on the package are not tested.

Testing of complex semiconductor packages can also be achieved by another method called ECIPT, Electronic-Chip-in-Place-Testing, as described in U.S. Pat. Nos. 4,494,066 and 4,441,075. ECIPT provides for a design approach and testing method which allows for the testing or each individual chip or a plurality of interconnected chips through the module pins without physically disconnecting the chip under test. This methodology calls for loading into a set of master-slave latch pairs (L1/L2) attached to each I/0 of every chip appropriate binary values which will in turn control all the off-chip drivers of all other chips on the unit not under test, and in this manner allow for the chip under consideration to be tested as if it were alone on the module. Thus, by electrically isolating the chip under test from all others, it becomes now possible to apply to it all the test vectors originally generated for the chip under test at water testing time.

This method of testing has the disadvantage of requiring the handling of very large volumes of test data which requires a sophisticated data management system and usually a large mainframe. The testing process is, in addition, expensive and time consuming. Moreover, it imposes on the designer certain constraints and limitations prompted by the requirement or a pair of master-slave latches attached to every I/0 of every chip on the module.

Lately, work performed by JTAG (Joint Test Action Group) has led to the development of a technique called "Boundary-Scan" which is described in two papers entitled: "Boundary-Scan—A Framework for Structured Design-for-Test", by Maunder and Beenker, and "Testing a Board with Boundary Scan" by van de Lagemaat and Bleeker, both in the Proceedings of the 1987 International Test Conference, September 1987, pp. 714–723, and pp. 724–729, respectively.

The boundary-scan technique involves the inclusion of a shift-register latch (contained in a boundary-scan cell) adjacent to each functional component pin. This allows the signals at component boundaries to be controlled and observed using scan testing techniques.

Proponents of this technique acknowledge that a majority of boards are not designed exclusively with in-house custom parts, and that semi-custom and merchant chip vendors fail to incorporate standard boundary-scan designs in their products. Consequently, this technique cannot be accepted as a universal solution to testing a fully populated board.

Testing of components prior to assembly on a board does not necessarily guarantee that the board will function properly in the system environment in which the board is designed to operate. Neither does it ensure that latent component failures may not eventually appear and disrupt the operation of the system. Clearly, at this point new techniques are required to: (1) isolate failures and (2) identify and replace the failing components. To reapply once again the sequence of test vectors, whether deterministic or functional, that were previously used at testing time does not always guarantee success. Appropriate diagnostic techniques are required to automatically detect, isolate, and repair any failures that may occur prior to system delivery or in the field.

SUMMARY OF THE INVENTION

The present invention comprises circuitry and a diagnostics method or methodology, which obviates the problems of prior art approaches and allows the detection to a defective component contained on or within a high density packaging structure. This methodology is accomplished by means of unit-in-place diagnostics performed sequentially on each individual board component or jointly on any number of selected components. This invention makes use of connector cards judiciously placed on the board to replace one or more components on the board. These connector cards are used to provide boundary-scan capabilities and broadside access from board pins to permit the isolation of any one or group of components from one another.

The invention puts no requirement or burden on the designer or manufacturer to comply with the aforementioned boundary-scan design technique in their individual chip or module design. During the process of diagnosing a board, it is possible to isolate any component lacking boundary-scan design features by using one or more or the connector cards described herein that provide direct or indirect connection paths to the card I/0 pins, thus permitting the application of unit-in-place techniques to the desired components.

The invention contemplates placing self-test circuitry on the connector cards. This makes it possible to test and diagnose the populated board without requiring the availability of complex test equipment and expensive test generation.

As stated earlier herein and as will be more fully apparent from the detailed description of our invention set forth hereinafter, once isolation of a component on the board has been achieved, it is possible to use the aforementioned connector card to complement test equipment with a limited number of tester channels and achieve in this manner full testing of the aforementioned isolated component.

It is, therefore, a primary object of this invention to provide the capability of diagnosing a failed board populated with a plurality of electronic components of diverse origin and components unit-in-place.

It is a further object of this invention to provide the ability of performing board/component testing/diagnostics by means of a tester with limited number of tester channels.

It is yet another object of this invention to provide the capability of applying through-the-pins tests, as well as functional speed tests to any board component while that component is in place on the card or board.

It is yet a further object of this invention to achieve full diagnostics of the components on a board by providing means to allow the I/O's of each component when under test to connect to the board I/O's.

It is another objective of the present invention to provide means to test components in situ on a board or card where the component under test has more input/output pins than does the board or card on which the circuit under test is mounted.

It is another object of this invention to provide boundary scan capabilities to semi-structured design without requiring the designer to provide boundary scan latches on the individual electronic components.

It is yet another object of this invention to provide self-test mechanisms on the connector cards to achieve in-situ self-test and machine speed testing.

It is still another object of this invention to provide means of applying gross AC testing capabilities to the board components unit-in-place.

BRIEF DESCRIPTION OF THE DRAWINGS

The foregoing and other objects, features and advantages of the invention will be apparent from the following more particular description of the invention and the preferred embodiment of the invention as illustrated in the accompanying drawings which form a part or the disclosure wherein.

DESCRIPTION OF THE PREFERRED EMBODIMENT

Figure 1:
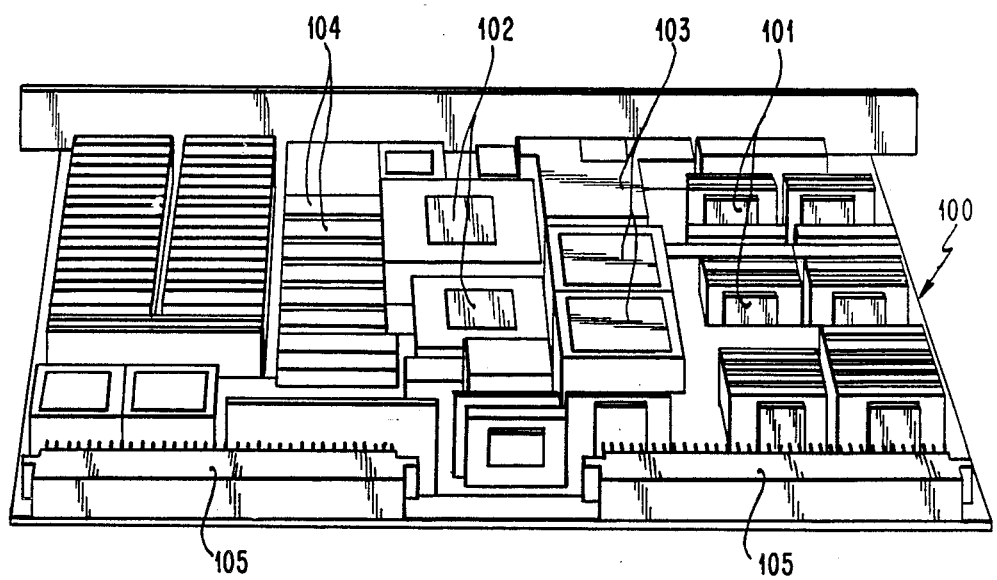
FIG. 1 illustrates a fully populated pre-wired board containing a plurality of hybrid electronic components, of different nature, origin and design.

The broad overall concept of the present invention applies to a pre-wired board 100 of the type illustrated in FIG. 1. This board has a plurality of electronic components mounted thereon including cards 101, modules or multi-chip modules, 102 and 103, dip packaged components 104, etc. These components are of a mixed nature, origin and technology, both, at the chip and at the module level. Oftentimes, these modules may follow a strict set of design for testability rules, or may incorporate characteristics that apply to a structured design. Others, may be vendor components with a unique function whereby economic considerations may preclude a designer from incorporating extra circuitry that potentially could increase cost. All these components are then mounted on the board 100 and arranged in a manner so as to increase its performance and operation.

Each board 100 has at least one I/0 socket 105 which has a plurality of input/output pins which are wired to various points on the board 100 and provides the mechanism for connecting signals to and from the board and the external system elements. A plurality of such boards may eventually end up populating one or several frames that form a complex system. The efficiency of the overall package helps to determine the performance of the system. Too often, though, little thought and consideration is given to the testability at the various packaging levels, and even less perhaps, to the ease of diagnosing a failing component.

UNIT-IN-PLACE DIAGNOSTICS SETUP

The proposed method described herein requires that each pin on each component mounted on the board 100 be connectable curing testing thereof either to a shift-register latch (SRL), or to a board input/output pin. The SRL can be located either on the multi-chip module such as 102, 103 and cards 101, or on a connector card that is inserted in an empty socket (not shown) made vacant by removal of a component on the board 100 during test or any combination thereof. For the purpose or conserving input/output pins to the board, all the SRLs are wired together in series so that data can be scanned in or out or the SRLs through one board I/0 pin. Clocking is also required so a total of four board level I/0 pins must be dedicated to the testing/diagnosing functions described herein when an SRL is involved. The remaining board I/0 pins can be coupled by a connector card to I/0 pins of the component under test.

THE CONNECTOR CARD

Figure 2:
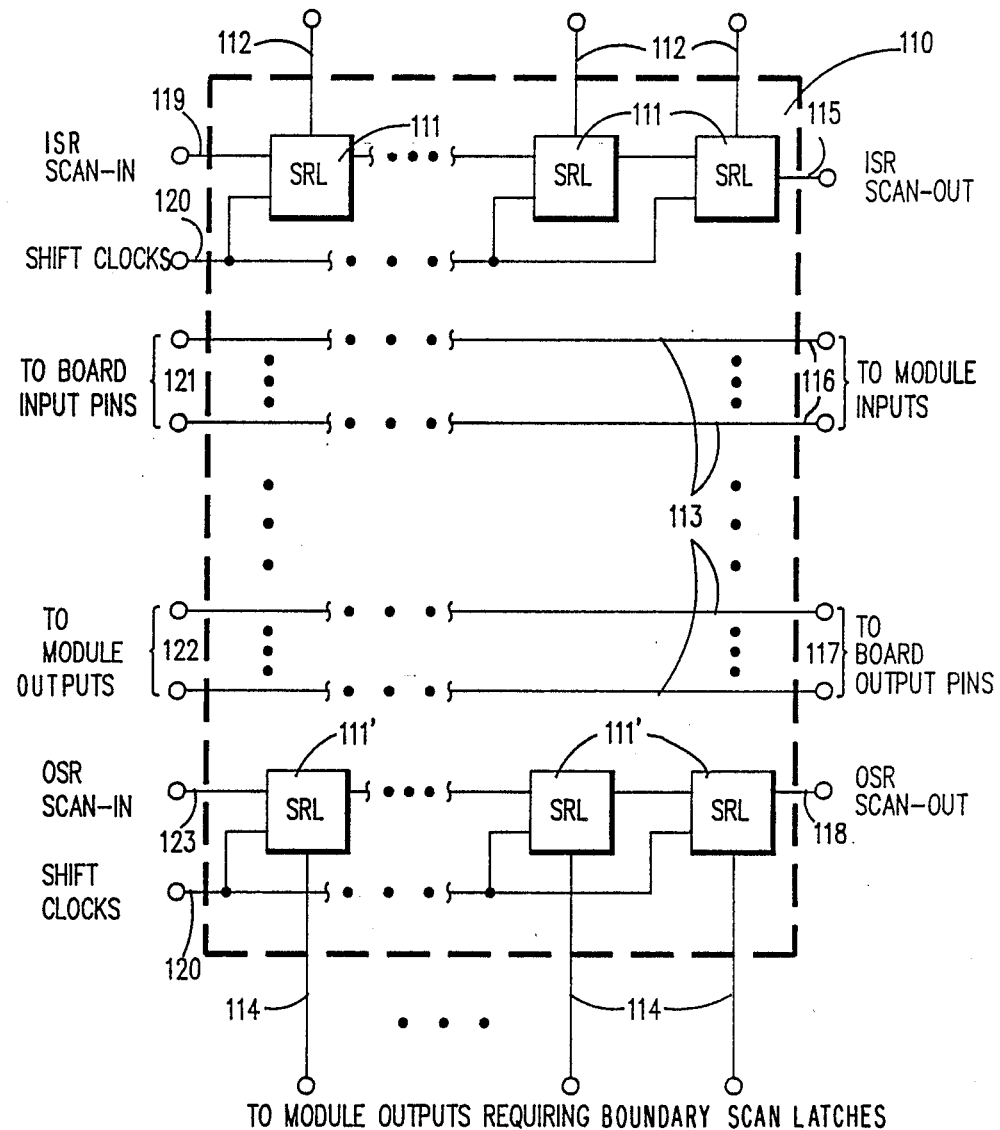
FIG. 2 is a connector card containing two sets of shift-register latches, that provide boundary scan and/or self-test capabilities wherever required or desired.

A connector card 110 as illustrated in FIG. 2, is utilized to provide the mechanism for testing the components on the board 100. Each empty socket (not shown) produced by removal of one or more components from the board 100 has a plurality of I/0 pins which are used to connect the board 100 I/0 pins to I/0 pins of the component under test. Each empty socket also has a plurality of pins which are each coupled to I/0 pins of components remaining on the board 100 which are to be tested. When no connector card is plugged into the empty socket, there is no connection between the board I/0 pins and the component pins via the empty socket. When a connector card is inserted, however, the I/0 pins of the component under test are coupled directly to the board I/0 pins rendering the input pins of the component under test controllable from the board input pins and the output pins of the component under test observable from the board output pins.

In addition, a socket (not shown) can be provided by design to aid in testing the circuit board. This socket will have a plurality of pins thereof coupled to a plurality of I/0 pins of a component to be tested. The socket will also have a plurality of pins coupled to the board I/0 pins. When a connector card is not inserted, the component under test is not coupled to the board I/0 pins. When a connector card is inserted, however, the I/0 pins of the component under test are coupled to the board I/0 pins rendering the input pins of the component under test controllable from the board I/0 pins and the output pins of the component under test observable from the board I/0 pins.

A connector card 110 may have several types of circuits and electrical wiring thereon. The circuits and the wiring provide the electrical network to couple the board I/0 pins to the I/0 pins of the components on the board 100. A typical connector card 110 (FIG. 2) may have a number of direct connection wires 113 which function to couple the component input pins 116 to the board input pins 121, and component output pins 122 to the board output pins 117. The direct connection wires 113 can be used to test components having fewer or as many I/0 pins as there are in the board connector 105 of FIG. 1.

When the component on the board 100 has more I/0 pins than does the board, an alternative approach is employed which involves the use of shift register latches (SRL) 111 to couple to the component inputs and shift register latches 111= to couple to the component outputs. To test a component using the SRL's, 111, 111=, data is scanned into the input SRLs 111 and applied to the component under test. The output pins of the component under test are coupled to the output SRLs 111= which latches the response of the component under test. That data is subsequently scanned out of the output SRLs 111= via the board pins.

Each SRL latch 111 on the upper edge of the card 110 in FIG. 2 is connected to form a shift register chain called ISR (Input-Shift-Register) with the ISR Scan-in pin 119 feeding the first SRL of the chain, and the last SRL feeding the ISR scan-out pin 115. The ISR provides boundary-scan capabilities to the components on the board 100. The shifting operation is accomplished by a plurality of shift clock pulses on clock line 120. The clocking transfers data from one SRL to the next SRL serially. Data is inputted to each SRL 111 via connector card input pin 112, which are then attached via the socket on the board 100 to the component inputs that require boundary-scan latches.

A similar arrangement of SRL's 111= to the one previously described is used to form the Output-Shift-Register (OSR) chain shown on the bottom of FIG. 2. The OSR scan-in line 123 feeds the first SRL 111= in the OSR chain. The last SRL 111= of the OSR chain feeds the OSR scan-out line 118. Shift clocks 120 are used to shift the data contained in the OSR chain. Data is inputted to each SRL 111= of the OSR chain via the connector card input pin 114 which are connected via the socket on the board 100 to the component outputs that require boundary-scan latches.

The SRL blocks 111, 111= of FIG. 2 can be either a simple master-slave shift register latch L1/L2, 130/131 (FIG. 3) or a doubled buffer arrangement L1/L2/L3, 133/134/135, called SSRL (Stable Shift Register Latch) 132. The SSRL's 132 are used to interface with sequential circuits within the logic, in the event of a non-structured described, whereas the simpler SRL latches 111, 111= are used to interface with combinatorial elements within the logic.

Figure 3:
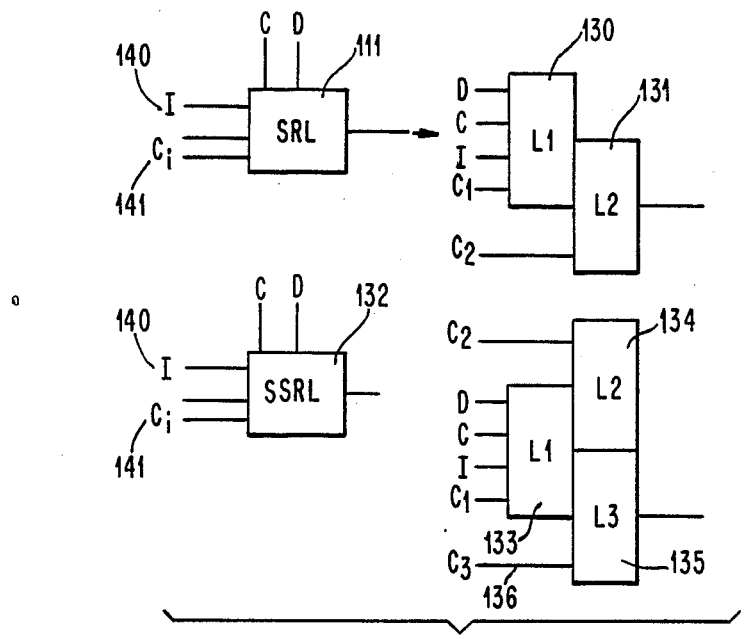
FIG. 3 illustrates the details of a shift-register arrangement as it applies for interfacing with either purely combinatorial logic or with sequential logic.

Referring to the lower part of FIG. 3, latches L1/L2 133/134 are used to shift in the desired test pattern, with clock C3 136 off to ensure that the shift sequences do not disturb the test patterns stored in latch L3 135. The outputs from the buffer latch L3 135 feeding the sequential logic hold the values of test pattern n while test pattern n+1 is shifted in from ISR Scan-in line 119 of FIG. 2. When clock C3, 136 is enabled, test pattern n+1 is applied to the sequential logic. This arrangement ensures race-free testing of the modules/cards containing sequential logic circuitry. All other lines inputting to the L1 latches 130 are well known to the state of the art and will not be further discussed. Additional information on the aforementioned lines and operation of the latches coupled thereto are fully described in U.S. Pat. Nos. 3,806,891, 3,761,695, 3,783,254, and 3,784,907 and these patents are herein incorporated by reference.

It will be perceived by those of skill in the art that the present invention involves a new method of testing components in situ. The first aspect of the invention involves isolating a component mounted on the circuit board from other components on the board. This is done by removing components from the board which couple to the input/output pins of the component suspected of failing.

Once the component suspected of failing is isolated, one or more connector cards are mounted on the board by plugging them into the socket(s) vacated by removed components. The connector cards provide either direct connection or shirt register latch coupling between the I/O's of the component suspected of failing and the board I/O's.

Once the suspected component is isolated and coupled by one or more connector cards plugged into vacated component sockets on the board, test stimuli are applied to the suspected component via the board input pins and responses are recorded via the board output pin(s). The responses can thereafter be analyzed to determine if the suspected component is, in fact, a failing component.

The present embodiment can be further expanded by including a self test mechanism on the connector card. The aforementioned ISR and OSR chains in FIG. 2 can be configured as a LFSR (Linear Feedback Shift Register) and/or MISR (Multiple Input Shift Register) which are respectively used to generate a set of pseudo-random test patterns, and accumulating responses through signature compression and analysis, thus providing self-test capabilities to one or several groups of components on the board 100. An LFSR is illustrated in U.S. Pat. Nos. 4,687,988 and 4,745,355. No further description of the self-test mechanism is required, since this is well known in the state of art, and fully described in U.S. Pat. Nos. 4,513,418 and 4,519,078 and the references cited therein which are all herein incorporated by reference.

The presence of the aforementioned self-test circuitry on the connector cards allows for real-time in-situ diagnostics of the unit under test which may comprise a single or a plurality of components.

UNIT-IN-PLACE DIAGNOSTICS METHODOLOGY

The board 100 of FIG. 1 is initially tested unpopulated. Each component, prior to its mounting on the board is also individually tested. Once fully populated, the board is tested by applying a stream of test instructions to the populated board 100 through the board I/O's until a failure is recorded. This is a functional test. Once a failure is detected the objective becomes to recreate the failing conditions by reapplying a subset of the original test instructions. If the subset rails to recreate this failing condition, it is augmented by an additional subset of n immediately preceding test instructions from the original test set. This process is repeated until the failed condition is replicated. The set of test instructions thus obtained is then used by a logic simulator to extract test patterns (and expected responses) at the board component boundaries for each of the m components on the board 100.

Using the aforementioned unit-in-place diagnostics setup (FIG. 4), the extracted test patterns $T_i$ are applied to each of the m board components via the combination of:

1. direct board inputs which are connected to the unit under test (UUT) 141 via lines 148,
2. connector board input pins 158 are coupled to the connector card 140 via cable 146, which, in turn, are attached to the UUT 141 via cable 156 through the connector card 140, and
3. boundary scan-in line 147 through the ISR chain 144 whose outputs feed the UUT 141 via cable 155.

The output responses are observed via the combination of:

1. direct board outputs which are connected to the UUT 141 via lines 149,
2. connector board output pins are coupled to the connector card 142 via cable 145, which, in turn, are attached to the UUT 141 via cable 150 through connector card 142, and
3. boundary scan-out line 152 through the OSR chain 153 whose inputs are fed from the UUT 141 via the cable 150.

The UUT 141 can be tested unit-in-place using the embedded wires on the circuit board 100 provided that all other modules on the board communicating with UUT 141 are replaced with appropriate connector cards.

A defective board component is thus isolated and identified when the applied test Ti fails.

In assigning the connections between the connector board inputs 158 and the UUT inputs 159 via the connector card 140, considerations should be given to provide direct broadside connections to those portions of the logic that are system sensitive, so that test patterns can be applied at machine speed if so desired, to screen the board component for AC timing related failures. Moreover, boundary scan latches on the connector cards are used only when direct connections are not possible because of an insufficient number of tester channels available for testing the unit under test 141.

Figure 4:
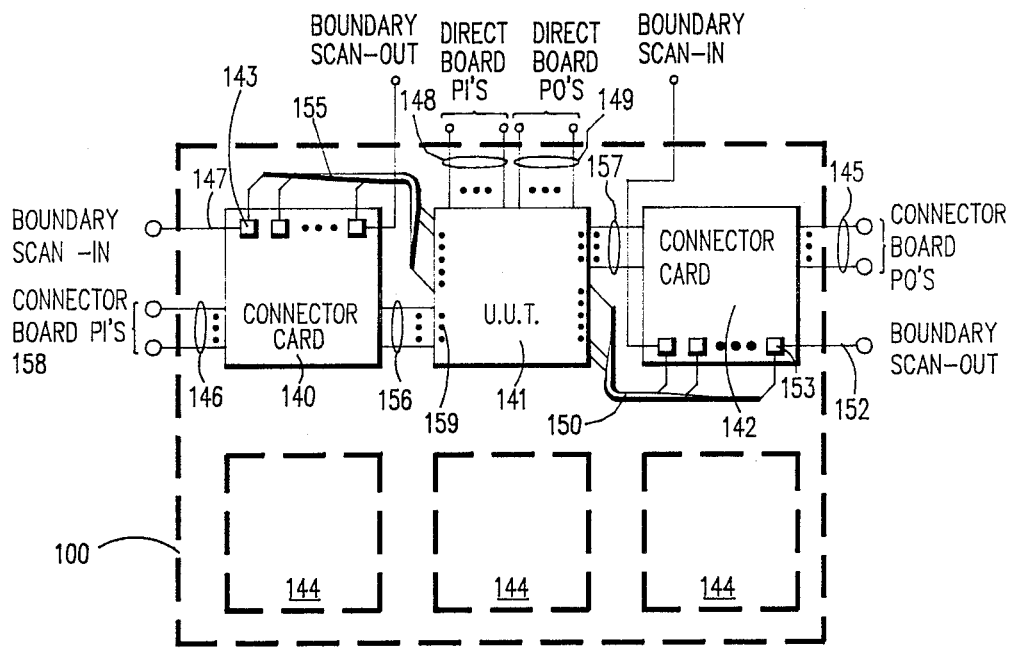
FIG. 4 illustrates an unpopulated board with one electronic component card and a plurality of connector cards for testing and diagnostics purposes.

Still referring to FIG.4, using the same unit-in-place diagnostic setup, the same test pattern set can be used to further diagnose the identified failed board component(s) down to failing chip(s) or failing circuit contained therein. Oftentimes, additional test patterns may be required particularly when diagnosis down to a failing circuit within a chip is desired.

The unit-in-place diagnostics methodology of the present invention employs the following steps: (1) Removing at least one component from the circuit board. (2) Installing in the socket(s) vacated by the removed component(s) a coupling means to couple I/0 pins of a selected component remaining on the circuit board with board I/0 pins. (3) Applying a plurality of test instructions to the selected component via the board input pins. (4) Storing the response signals received from the selected component at the circuit board output pins in response to the applied test instructions. (5) Comparing the stored response signals with expected response signals. (6) Indicating the selected component as failing when the expected response signals and stored response signals are not identical.

Figure 5:
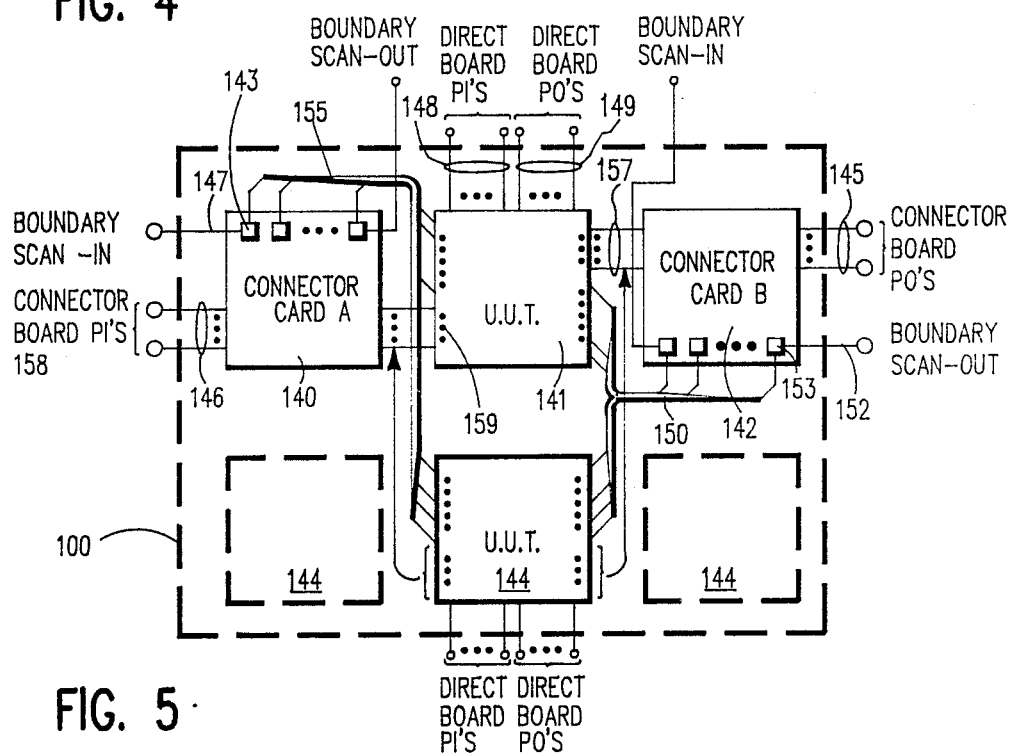
FIG. 5 illustrates an unpopulated board comprising more than one unit-under-test attached to a plurality of connector cards in the process of being diagnosed.

The aforementioned unit-in-place diagnostics set-up and methodology can be extended to an expanded unit under test that is comprised of a selected group of interacting modules/cards on the board 100 as shown in FIG. 5.

Figure 6A:
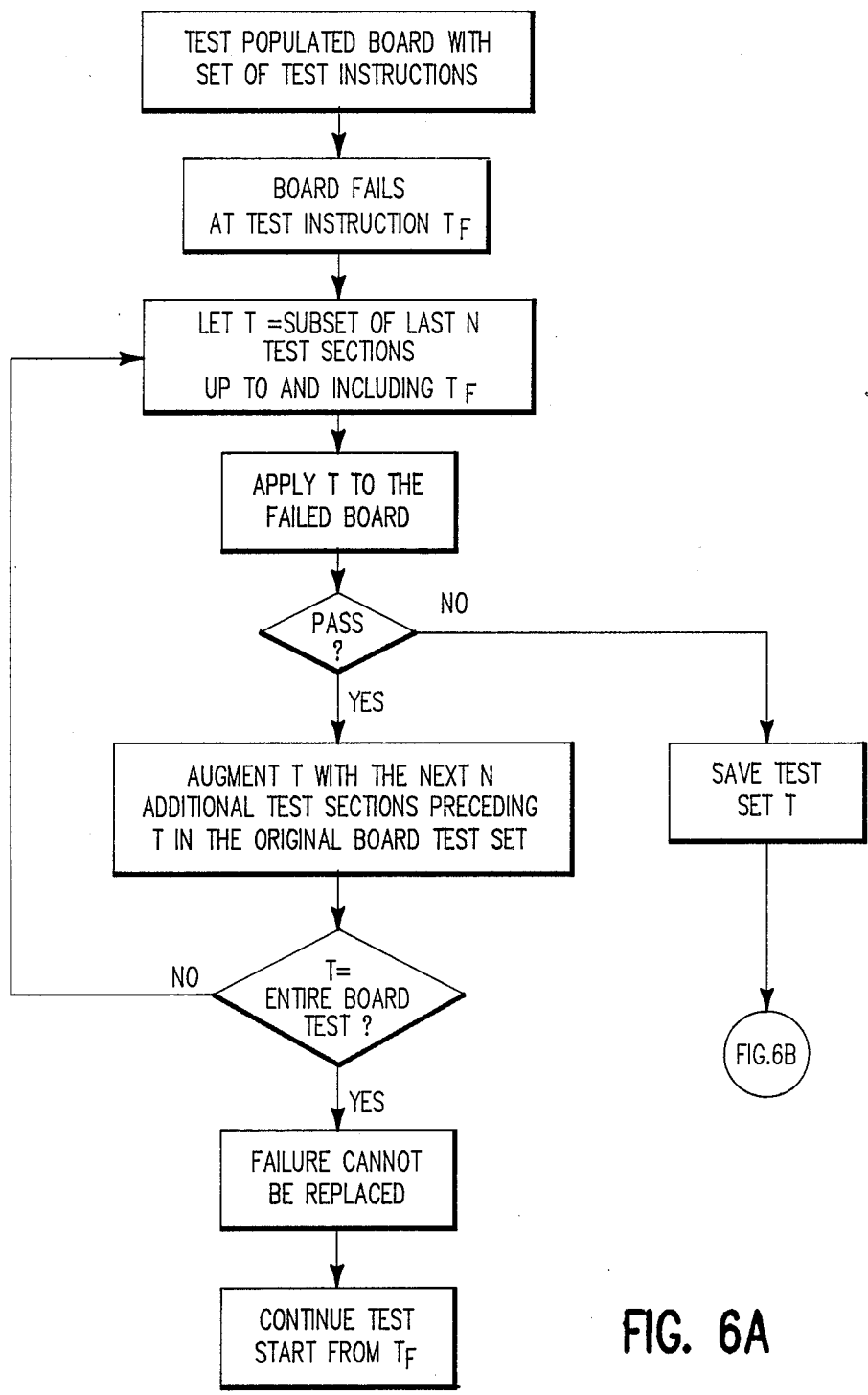
FIGS. 6A and 6B show a flow chart which summarizes the various steps for diagnosing a populated board comprised of hybrid electrical components.
Figure 6B:
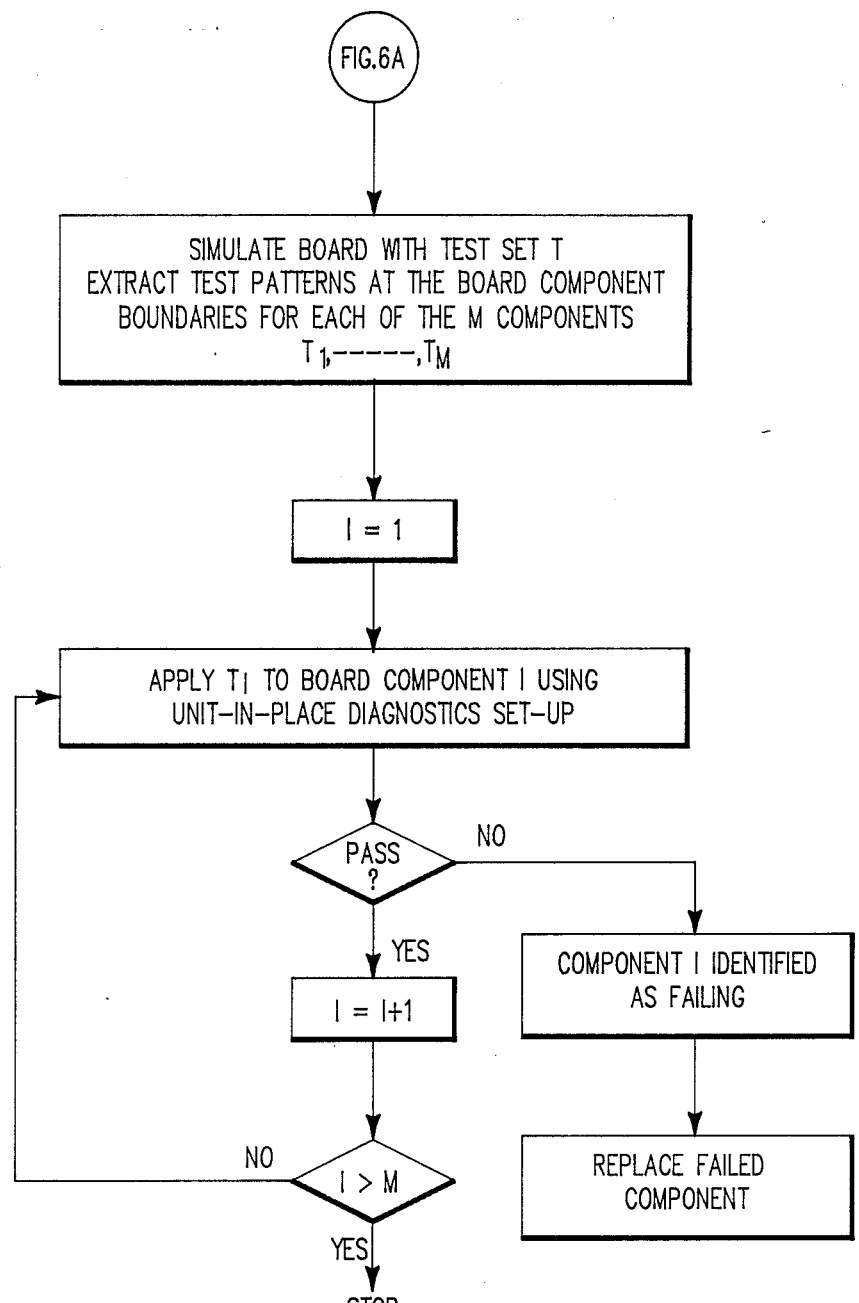

FIGS. 6A and 6B comprise a flow-chart which summarizes the board diagnostic method using the present invention. In sum, FIGS. 6A and 6B are comprised of the following six steps:

i. The populated board is tested with the complete set of test instructions T. At a certain point $T_F$, the board may be found to fail.

ii. The set of test instructions is subdivided into subsets of variable length called test sections, each subset comprised of a plurality of self contained instructions. The set of the last N test sections T is then applied to the board.

iii. If this failure is captured by this subset of instructions, we let T be comprised of this set. If the failure is not detected by T, we augment T by the next to the last set of N test sections, and reapply T to the board. This process is iterated until the failure is reproduced. At that point, the augmented T constitutes the final diagnostics test set. If the board passes the entire set of test instructions at re-test, then the failure previously detected in (i) is of a transient nature. Board rest will then resume starting from $T_F$ with an error logging of a transient failure detected at $T_F$.

iv. Conventional simulation is performed on the board logic model using T as the input stimulus. From this simulation, test patterns at the board component boundaries are extracted for each of the M components on the board, $T_1, \ldots, T_M$.

v. $T_I$ (I=1, on the first pass) is applied to the board component I using the unit-in-place diagnostics setup. If no failure is detected we let I be incremented by 1 and apply the appropriate $T_I$ to its corresponding component. This process is continued until all failing components are detected. At this point the process stops. The defective components are replaced.

vi. The failing components extracted from the board can now be diagnosed further using the aforementioned unit-in-place diagnostic setup technique. (Note: to localize a failure to a precise location may require additional diagnostics data).

There are alternative configurations to those illustrated above. For example, some of the components mounted on the board 100 of FIG. 1 may be mounted in a socket on the board. If such component has at least three or four input/output pins which are connected to the board input/output pins, the component can be removed from the socket and a connector card placed therein. The connector card may include jumper wires between selected board I/0 pins coupled to the socket and I/0 pins from components not removed from the board. The connector card may also have a plurality of shift register latches thereon. These latches are coupled to the board I/0 pins and to the input/output pins of components not removed from the board. The function of the connector card in this alternative is the same as described earlier. The principal difference in this configuration is that jumper wires are used in lieu of board interconnections to test the UUT.

Another alternative configuration occurs when at least one of the components mounted on the board 100 are designed with LSSD or boundary scan design rules. In either case, the component has a shift register latch for assisting in testing the component. To further facilitate testing of the board, a connector card is provided with a shift register latch thereon. When the card is mounted on the board, the card carried shift register latches become series-coupled with the component shift register latch(es). This provides the necessary means to use a combination of component internal SRL's on the connector card to perform diagnostics testing. In this fashion, test data can be scanned into numerous components on the board thereby permitting testing of more than one component during any given test.

While this invention has been particularly described with reference to the preferred embodiment thereof, it will be understood by those skilled in the state of the art that the foregoing and other changes in form and details may be made therein without departing from the spirit and scope of this invention.

We claim:

1. A method for isolating and diagnosing in situ failing or defective components mounted on a circuit board having a plurality of interconnected components mounted thereon, the circuit board having a plurality of board input/output pins, the method comprising the steps of:
   1. removing at least one said component from said circuit board;
   2. installing a connector card in place of at least one said removed component, said connector card providing means to couple at least some of the input/output pins of a selected component mounted on said circuit board to some of said board input/output pins;
   3. applying test patterns to at least some said board input/output pins coupled to said selected component; and
   4. recording the responses from said selected device on at least some of said board input/output pins in response to said test patterns.

2. A method for testing components in situ of a circuit board having a plurality of components thereon, the method comprising the steps of:
   removing at least one component from the circuit board;
   installing a card in the socket vacated by at least one said removed component to couple signals from board input pins to the input pins of a selected component remaining on the board and for coupling signals from output pins of said selected component to output pins of said board;
   applying in-situ a set of test instructions for testing a selected board component via the input pins of said board;
   storing the response signals at the circuit board output pins which are received from the output pins of said selected component, said response signals being produced in response to said set of test instructions;
   comparing the stored response signals with expected response signals; and
   indicating as defective said selected component if the response signals are not the same as expected.

3. In an improved system for isolating and diagnosing in situ failing or defecting components mounted on a circuit board having a plurality of components mounted thereon and interconnected with each other, each component having a plurality of input and output pins and the circuit board having a plurality of input and output pins, the system comprising:
   a card mountable on the circuit board where at least one component normally mounted thereon has been removed to isolate and make testable a selected component remaining on the circuit board by rendering the input pins of said selected component controllable from the circuit board input pins and the output pins of said selected component observable from the circuit board output pins, a plug for inserting in the socket vacated by said removed component and having a plurality of pins, at least some of said pins being coupled to said board input and output pins and at least some of the remainder of said pins being coupled to said selected component input and output pins, and whereby said card to which said plug is mounted has a plurality of wires thereon, each for connecting one of said pins coupled to a board input or output pin to a pin coupled to an input or output pin of said selected component.

4. The system of claim 3 wherein said means mountable on the circuit board includes a shift register having a plurality of stages, a clock input coupled to all said stages to gate data from one stage to the next, an output from each stage coupled to an input pin of said selected component, a shift register data input coupled to a board input pin and said clock input being coupled to a board input pin thereby rendering it possible for a plurality of said selected component input pins to receive data form a single board input pin.

5. The system of claim 3 wherein said mountable means includes a shift register having a plurality of stages, clock circuit means coupled to all said stages to gate data from one stage to the next, an input to each said stage coupled to an output pin of said selected component, a shift register data output coupled to a board output pin and said clock circuit means being coupled to at least one board input pin to receive clock pulses therefrom thereby rendering it possible for a plurality of said selected component output pins to be observed at a single board output pin.

6. The system of claim 4 wherein said mountable means includes a second shift register having a plurality of stages, a second clock circuit means coupled to all stages of said second shift register to gate data from one stage to the next, an input to each said second shift register stage coupled to an input pin of said selected component, a shift register output coupled to a board output pin and said second clock circuit means being coupled to a board input pin to receive clock pulses thereon thereby rendering it possible for a plurality of said selected component output pins to be observable at a single board output pin.

7. A system for testing in situ one of a plurality of components, each with a plurality of input/output pins, mounted on a circuit board, at least one said component being designed in a manner not complying with either LSSD or boundary scan design rules, the circuit board having a plurality of input/output pins, the system comprising:

coupling means for mounting on said circuit board when at least one component has been removed therefrom, said removed component having been coupled by wires on said circuit board to at least one input/output pin of a selected component not removed from said circuit board, said selected component not complying with either LSSD or boundary scan design rules, said removed component having been coupled by other wires on said circuit board to at least one board input/output pin, said coupling means including means to couple at least one board input/output pin to at least one of said selected component input/output pin thereby rendering at least some of said selected component input/output pins testable directly from said board input/output pins; and wherein said coupling means includes a multi-stage shift register latch coupled to one board input/output pin and a plurality of said selected component input/output pins, said shift register latch having clock gating circuitry for receiving clock signals from at least one said board input/output pin to gate signals from one said stage to the next stage.

8. The system of claim 7 including a second multi-stage shift register latch, said first shift register latch having each stage thereof coupled to some said selected component input/output pins and said second shift register stages are coupled to other said selected component input/output pins, said second shift register latch having clock gating circuitry for receiving clock signals from at least one said board input/output pin to gate signals from one said stage of said second shift register latch to the next said stage of said second shift register latch.

9. The system of claim 3 additionally including a pseudo-random test pattern generator disposed on said means mountable on the circuit board, said test pattern generator being responsive to signals on selected board input pins coupled thereto to produce at least one test pattern to input pins of said selected component.

10. The system of claim 7 additionally including a pseudo-random test pattern generator disposed on said means mountable on the circuit board, said test pattern generator being responsive to signals on selected board input pins coupled thereto to produce at least one test pattern to input pins of said selected component.

11. The system of claim 9 including a signature register disposed on said means mountable on the circuit board, said signature register being coupled in use to receive and accumulate signals from output pins of said selected component, said signature register being coupled to output pins of said board thereby rendering the content of said signature observable from a board output pin.

12. The system of claim 10 including a signature register disposed on said means mountable on the circuit board, said signature register being coupled in use to receive and accumulate signals from output pins of said selected component, said signature register being coupled to output pins of said board thereby rendering the content of said signature observable from a board output pin.

13. A method for testing a circuit board having a plurality of components thereon, the method comprising the steps of:
(i.) testing a fully populated circuit board with a complete set of test instructions T, where said complete set of test instructions is divided into subsets of variable length, until a failure is detected during execution of test subset $T_F$;
(ii.) retesting said fully populated board with said test subset $T_F$ and augmented with increasingly earlier test subsets until said failure is again detected;
(iii.) simulating the logic of said fully populated circuit board with all said test subsets found to reproduce said detected failure and extract the simulated signal values at each of the board component input/output pins to form a set of test instructions for each component on said circuit board; and
(iv.) diagnosing the failed board by applying the unit-in-place, through-the-pins testing method of claim 15 to each said component on said circuit board using the test instructions determined in step (iii.) for each said component on the circuit board.

* * * * *